(12) United States Patent
Watanabe et al.

(10) Patent No.: US 8,529,696 B2
(45) Date of Patent: Sep. 10, 2013

(54) METHOD FOR PRODUCING HEXAGONAL BORON NITRIDE SINGLE CRYSTALS

(75) Inventors: Kenji Watanabe, Tsukuba (JP); Takashi Taniguchi, Tsukuba (JP); Satoshi Koizumi, Tsukuba (JP); Hisao Kanda, Tsukuba (JP); Masayuki Katagiri, Tsukuba (JP); Takatoshi Yamada, Tsukuba (JP); Nesladek Milos, Tsukuba (JP)

(73) Assignee: National Institute for Materials Science, Tsukuba-Shi (JP)

( * ) Notice: Subject to any disclaimer, the term of this patent is extended or adjusted under 35 U.S.C. 154(b) by 0 days.

(21) Appl. No.: 13/561,695

(22) Filed: Jul. 30, 2012

(65) Prior Publication Data

US 2012/0291695 A1  Nov. 22, 2012

Related U.S. Application Data

(60) Continuation of application No. 12/588,462, filed on Oct. 16, 2009, now Pat. No. 8,258,603, which is a division of application No. 10/566,722, filed as application No. PCT/JP2004/017434 on Nov. 17, 2004, now abandoned.

(30) Foreign Application Priority Data

| Nov. 18, 2003 | (JP) | 2003-388467 |
| Feb. 12, 2004 | (JP) | 2004-035501 |
| Sep. 8, 2004 | (JP) | 2004-260480 |

(51) Int. Cl.
*C30B 9/00* (2006.01)

(52) U.S. Cl.
USPC .............. 117/81; 117/73; 117/78; 117/952

(58) Field of Classification Search
USPC .................................. 117/73, 78, 81, 952
See application file for complete search history.

(56) References Cited

U.S. PATENT DOCUMENTS 4,409,193 A * 10/1983 Sato et al. ............... 423/290
2004/0040490 A1 * 3/2004 Yamanaka et al. ............ 117/2

FOREIGN PATENT DOCUMENTS

WO  WO 0234972 A1 * 5/2002

* cited by examiner

*Primary Examiner* — Matthew Song
(74) *Attorney, Agent, or Firm* — Manabu Kanesaka

(57) ABSTRACT

A method for producing hexagonal boron nitride single crystals including mixing boron nitride crystals with a solvent thereby obtaining a mixture, heating and melting the mixture under high-temperature and high-pressure thereby obtaining a melted mixture, and recrystallizing the melted mixture thereby producing hexagonal boron nitride single crystals, wherein the solvent is boronitride of alkaline earth metal, or boronitride of alkali metal and the boronitride of alkaline earth metal.

6 Claims, 12 Drawing Sheets

METHOD FOR PRODUCING HEXAGONAL BORON NITRIDE SINGLE CRYSTALS

CROSS-REFERENCE TO RELATED APPLICATION

This is a continuation application of Ser. No. 12/588,462 filed on Oct. 16, 2009, now U.S. Pat. No. 8,258,603, which is a divisional application of Ser. No. 10/566,722 filed on Feb. 2, 2006 (which is abandoned), which is a national stage entry of PCT/JP2004/017434 filed on Nov. 17, 2004.

FIELD OF THE INVENTION

The present invention relates to a method for producing hexagonal boron nitride single crystals capable of emitting high-luminance far ultraviolet light with a maximum emission peak at a wavelength of 235 nm or shorter, particularly at 210 nm to 220 nm, and more particularly at 215 nm.

BACKGROUND OF THE INVENTION

Development of high-luminance ultraviolet light emitting elements is recently progressing toward practical use. Light emitting elements with the emission wavelength of the order of 300 nm have been proposed using various materials such as gallium nitride and solid solution thereof. For the changeover to the shorter wavelength of the emitting wavelengths of these solid-state light emitting elements, there is a large demand in fields such as high densification of recording media and others. To date, as the candidates for far ultraviolet light emitting element on a wavelength of the order of 200 nm, diamond, cubic boron nitride crystal (hereinafter, denoted by cBN) and aluminum nitride have been proposed and studies for application thereof are in progress.

In searching for materials for a high-luminance light emitting element in the far ultraviolet region, important characteristics include: having broad band gaps and chemical stability, and preferably to be direct transition type semiconductors, and the like. Except for above described materials, the solid-state light emitting materials with far ultraviolet light emission characteristics of the order of 200 nm include hexagonal boron nitride crystal (hereinafter, denoted by hBN) having about 5.8 eV band gap and being a direct transition type semiconductor. But there have been factors to prevent its realization. hBN has been used for a long time as a chemically stable insulator material, is synthesized by gas phase reaction of boron oxide and ammonia, and is now utilized in many forms (such as powder, sintered body, and film form).

However, hBN obtained by the above described gas phase reaction has contained impurities to make it difficult to obtain hBN having the far ultraviolet light emission characteristics corresponding to its specific band gap. In order to use this material as the high-luminance light emitting element in far ultraviolet region, it is necessary first to establish methods to synthesize highly pure single crystals, but there has been no report until now that the highly pure hBN single crystal with expected light emission characteristics has been successfully obtained by a hBN synthesizing method, aiming at its potential ability as a solid-state far ultraviolet light emitting element with the emission wavelength of the order of 200 nm.

As for the synthesizing method, hBN has been known to be synthesized by the thermal decomposition reaction or by the gas phase reaction between boron compounds such as boron oxide and ammonia, but it has been difficult to obtain highly pure single crystals by these reactions. Especially, they have never been considered established as the manufacturing methods of single crystal materials to use for semiconductors or the like.

On the other hand, cubic boron nitride crystal, a high-pressure phase of hBN, has been known to be synthesized by using hBN or the like as the raw material and boronitride of alkali metal or alkaline earth metal as a solvent and by recrystallizing said raw material in said solvent under high-temperature and high-pressure of 55,000 atmospheric pressure and 1,600° C. Obtained cBN single crystal has high hardness next to the diamond, and is widely used as a super hard material, and this procedure for synthesizing cBN has already been established industrially.

Because cBN synthesized in this way also has a broad band gap (Eg: 6.3 eV), it has been studied for a long time as a solid-state short wavelength light emitting element. However, every cBN single crystal hitherto reported is colored in amber, orange or the like, and the light emitting behavior corresponding to cBN specific band gap has not yet been able to be observed in this situation. As a possible cause thereof, large effect of impurities contained in the cBN crystal may be nominated. Therefore, in order to use the cBN single crystal as a material having specific light emission characteristics corresponding to the band gap of said crystal, establishment of synthesis reaction to achieve higher purification of cBN single crystal has become an important subject to study, as well as full understandings of light emission characteristics specific to cBN.

Under such background, it has been reported that synthesis of hBN single crystal was tried under the condition of cBN synthesis daringly changing the temperature and pressure conditions to those at which hBN is produced stably (non-patent literature 1). However, from the crystal-growth solvent used in the synthesis experiment in this report, only colored cBN crystals were obtained, and about the hBN crystal that was formed concurrently as a by-product, there was no description on the light emission behavior thereof at all or no suggestion on short wavelength light emission thereof.

In such a situation, the inventors of the present invention intensively studied the synthetic conditions for obtaining highly pure cBN single crystals. Consequently, they found factors necessary to obtain highly pure cBN single crystals, and thus succeeded in synthesizing highly pure cBN single crystals having optical characteristics specific to the cBN crystal, and reported in an academic literature (non-patent literature 2). This synthetic procedure was, in short, after establishing a clean and dry nitrogen-atmosphere, crystals were grown using highly pure solvent (such as barium boronitride) purified with utmost care. By this procedure, highly pure cBN single crystals were successfully obtained (non-patent literature 2).

Non-patent literature 1; H. Akamaru, A. Onodera, T. Endo, O. Mishima, J. Phys. Chem. Solids, 63, 887 (2002).

Non-patent literature 2; T. Taniguchi, S. Yamaoka, J. Cryst. Growth, 222, 549 (2001).

DISCLOSURE OF THE INVENTION

Problems to be Solved by the Invention

Above is the present situation of the hBN material or cBN, the high-pressure phase thereof, expected to have light emission characteristics in far ultraviolet range. Especially, hBN, a wide band gap semiconductor, is of direct transition type, and so is expected as a high-luminance and short wavelength solid-state light emitting element, but the present situation is as described above. In order to live up to the above expectation, it is urgent to derive the original characteristics of the substance, that is, to establish methods for synthesis of highly pure single crystals not being affected by contaminations, and it is expected to be realized.

Moreover, as light emitting apparatuses in the ultraviolet region, laser apparatuses using various kinds of gases or semiconductor light emitting apparatuses are known so far. But these apparatuses need cooling units and are large scale apparatuses, and are complicated and expensive with pn-junction, pin-junction and the like, so that ultraviolet light emitting apparatuses being simple, compact, low cost, and highly efficient are desired.

The present invention intends to meet these requirements. That is, the problem to be solved by the present invention is to synthesize highly pure hBN single crystals which has been impossible to be produced by the conventional hBN synthetic procedure, and using these, to provide an element capable of far ultraviolet high-luminance light emission reflecting the characteristics specific to hBN. Moreover, making use of said hexagonal boron nitride crystal having specific light emission characteristics, the invention intends to provide simple, compact, low cost, and highly efficient solid-state far ultraviolet lasers and solid-state far ultraviolet region high-luminance light emitting apparatuses, instead of conventional large-scale apparatuses using gases or complicated and expensive semiconductor apparatuses. That is to say, the invention intends to provide solid-state light emitting apparatuses utilizing the far ultraviolet solid-state light emitting elements adopting highly pure hexagonal boron nitride crystals having far ultraviolet light emission characteristics as active mediums.

Means for Solving the Problems

For the above purpose, the inventors of the present invention studied on the synthesis experiments reported in the above non-patent reference 2, for obtaining highly pure cBN single crystals starting from the raw hBN material using a clean and dry nitrogen atmosphere and purified solvents. They have tried experiments to survey in detail and to control the critical conditions to synthesize highly pure cBN single crystals, and have found that highly pure hBN single crystals can be obtained by appropriately adjusting conditions of the temperature and the pressure.

They then surveyed in detail the optical characteristics of said highly pure hBN single crystal obtained from the above findings, and found and clarified the following optical characteristics. That is, obtained crystals were colorless, transparent and highly pure crystals with high electric resistance. When the crystal was excited by electron beam irradiation with cathode luminescence, markedly high-luminance light emission at a wavelength of 215 nm was observed at room temperature. Also, at 83 K, light emission was observed at the wavelength of 210 nm to 235 nm. According to a light absorption experiment, an absorption spectrum showing light absorption at 208 nm and 213 nm was obtained. When this was compared with ultraviolet light emission from a highly pure diamond single crystal measured under the same condition, it was found that light emission intensity at the wavelength of 215 nm of the hBN single crystal at room temperature showed a value about 1000 times or more stronger than the diamond.

That is, as the result of intensive studies for obtaining highly pure hBN single crystals on the basis of prior arts described in the above references (non-patent literatures 1 and 2) as the preceding techniques, the present invention succeeded in the synthesis of highly pure hBN single crystals having a single light emission peak in the far ultraviolet region near a wavelength of 215 nm responding to electron beam irradiation only, by setting the hBN single crystal growing conditions to the reported synthetic conditions for obtaining highly pure cBN single crystals in the above non-patent literature 2.

Also, utilizing the above highly pure hexagonal boron nitride crystal as a light emitting element or a light emitting layer, and configuring and incorporating thereinto an exciting means by an electron beam irradiation, the inventors of the present invention have succeeded in easily designing and providing a simple, small-sized, highly efficient, solid-state far ultraviolet light emitting apparatus, unlike a conventional large-scale solid-state laser apparatus using gas necessary to be equipped with a water cooler, or conventional light emitting apparatus using a costly semiconductor solid-state light emitting device produced by repeating multiple layers of complicated pn-junctions and pin-junctions.

The present invention has been prosecuted based on a series of the above described findings and successes, and its embodiments are described in the following (1) to (15). Among them, a group of the inventions concerning highly pure hexagonal boron nitride single crystals, synthetic methods thereof, and light emitting elements consisting of said single crystals, given in (1) to (7), are denoted by the first group inventions. Also, the inventions concerning solid-state lasers capable of emitting far ultraviolet laser lights given in (8) and (9), wherein light emitting elements comprising said single crystals are combined with electron beam emitting means, are denoted by the second group inventions. Further, the inventions concerning the solid-state light emitting apparatus generating far ultraviolet light given in (10) to (15), wherein the light emitting layer consisting of said single crystal and the exciting means are integrally incorporated into a vacuum chamber, are denoted by the third group inventions.

(The First Group Inventions)

(1) Highly pure hexagonal boron nitride single crystals with far ultraviolet light emission characteristics emitting far ultraviolet light having the maximum light emission peak in the far ultraviolet region at a wavelength of 235 nm or shorter.

(2) The highly pure hexagonal boron nitride single crystals with the far ultraviolet light emission characteristics described in (1), wherein said far ultraviolet light is far ultraviolet light having the maximum light emission peak at a wavelength of 210 nm to 220 nm, remarkably at 215 nm.

(3) A method for producing highly pure hexagonal boron nitride single crystals with far ultraviolet light emission characteristics, characterized in that the highly pure hexagonal boron nitride single crystals with far ultraviolet light emission characteristics emitting far ultraviolet light having the maximum light emission peak in the far ultraviolet region at a wavelength of 235 nm or shorter are produced through the procedures of mixing the boron nitride crystals with a highly pure solvent, melting it by heating under high-temperature and high-pressure, and recrystallizing it.

(4) The method for producing highly pure hexagonal boron nitride single crystals with the far ultraviolet light emission characteristics described in (3), wherein said far ultraviolet light has the maximum light emission peak at a wavelength of 210 nm to 220 nm, remarkably at 215 nm.

(5) The method for producing highly pure hexagonal boron nitride single crystals with the far ultraviolet light emission characteristics described in (3) or (4), wherein said solvent is selected from nitride or boronitride of alkali metal or alkaline earth metal.

(6) A solid-state far ultraviolet light emitting element consisting of a highly pure hexagonal boron nitride single crystal, excited by electron beam irradiation to emit far ultraviolet light having the maximum light emission peak in the far ultraviolet region at a wavelength of 235 nm or shorter.

(7) The solid-state far ultraviolet light emitting element described in (6), wherein said far ultraviolet light is a single-peaked high-luminance light with the peak at a wavelength of 210 nm to 220 nm, remarkably at 215 nm.

(The Second Group Inventions)

(8) A solid-state far ultraviolet laser characterized by the generation of laser light with a far ultraviolet region wavelength, using a highly pure hexagonal boron nitride crystal with far ultraviolet light emission characteristics as a direct-type semiconductor solid-state light emitting element and combining therewith an electron beam irradiation apparatus as an exciting source.

(9) The solid-state far ultraviolet laser described in (8), wherein said light in the far ultraviolet region generated thereby is the single-peaked high-luminance laser light with a peak at a wavelength of 210 nm to 220 nm, remarkably at 215 nm.

(The Third Group Inventions)

(10) A solid-state far ultraviolet light emitting apparatus, characterized in that a light emitting layer consisting of a highly pure hexagonal boron nitride single crystal capable of emitting far ultraviolet light with a single emission peak in far ultraviolet region at a wavelength of 235 nm or shorter and an exciting means for exciting said light emitting layer are combined and encapsulated together into a vacuum container, and the light emitting layer is excited to emit far ultraviolet light by operation of the exciting means.

(11) The solid-state far ultraviolet light emitting apparatus described in (10), wherein said far ultraviolet light has a single peak at a wavelength of 210 nm to 220 nm, remarkably at 215 nm.

(12) The solid-state far ultraviolet light emitting apparatus described in (10), wherein said exciting means for exciting the light emitting layer is an electron beam emitting means.

(13) The solid-state far ultraviolet light emitting apparatus described in (12), characterized in that said exciting means by the electron beam emitting means consists of an anode electrode attached to the back surface of the light emitting layer consisting of a hexagonal boron nitride crystal, an electron beam emitting substrate attached to the light emitting layer through an insulating spacer, a cathode electrode attached to the back surface of the electron beam emitting substrate, and a means to apply voltage between both electrodes; and an electron beam is emitted from said electron beam emitting substrate toward the light emitting layer by application of voltage between both electrodes.

(14) The solid-state far ultraviolet light emitting apparatus described in (13), wherein said electron beam emitting substrate attached through said insulating spacer is a diamond substrate.

(15) The solid-state far ultraviolet light emitting apparatus described in (14), characterized by the structure of said diamond substrate wherein a large number of pyramid-shaped protrusions for emitting the electron beam are arranged in a lattice-like manner on the surface facing the light emitting layer.

Effects of the Invention

In the present invention, the first group inventions make it possible to create hexagonal boron nitride single crystals having specific light emission characteristics showing a strong and high-luminance light emission at a wavelength of 235 nm or shorter, particularly at 210 nm to 220 nm, remarkably at 215 nm in wavelength, not obtained by the prior art. Hereby, designing of solid-state high-luminance ultraviolet light emitting elements have become possible and various requirements for such as developments of more and more highly densified recording mediums and stronger sterilization by higher power output are able to be satisfied.

Also, in the present invention, the second group inventions make it possible to provide a compact solid-state light emitting element and a small solid-state laser having an oscillation wavelength of around 200 nm which has been difficult to be provided hitherto, by using a simple means to excite the element consisting of a highly pure hexagonal boron nitride single crystal with an electron beam.

Moreover, in the present invention, the third group inventions make it possible to provide a solid-state high-luminance light emitting apparatus compact, low cost, highly efficient, long lived, and having a single peak at the wavelength of 210 nm to 220 nm, especially at 215 nm at room temperature, by using a highly pure boron nitride crystal as the emitting layer and by incorporating integrally this emitting layer and an exciting means, especially an electron beam exciting means utilizing a substrate having an electron beam emitting part consisting of a diamond, into a vacuum chamber.

As described above, the present invention has succeeded in providing the compact solid-state light emitting element and the compact solid-state light emitting apparatus having the oscillation wavelength of 210 to 220 nm, especially at 215 nm, which has been difficult hitherto to be realized, and is expected to contribute largely to the development of various industrial fields. The compact, high power output, low cost and long lived solid-state far ultraviolet light emitting element and the solid-state laser, or the solid-state light emitting apparatus are desired in many fields, and the range of their utilization has broad divergence such as the field of semiconductors (for making the photolithography highly minute), the field of the information (next generation high capacity optical discs), the field of the medical care and living body (ophthalmological treatment, DNA cleavage and the like), and environmental field (sterilization and the like), and the benefit obtained therefrom may be immeasurable.

BRIEF DESCRIPTION OF THE DRAWINGS

FIG. 10-1 illustrates a preliminary step of a silicon substrate for producing a diamond electron emitting device, vapor-deposited with a $SiO_2$ layer.

FIG. 10-2 illustrates a process wherein a photoresist pattern is formed.

FIG. 10-3 illustrates processes of $SiO_2$ etching and $SiO_2$ mask pattern formation.

FIG. 10-4 illustrates a step of forming concave pyramid-shaped pits on the Si substrate and the sectional view of the Si substrate after completion of the step.

FIG. 10-5 illustrates a process to produce a diamond device by the CVD method using the etched Si substrate as the template.

FIG. 10-6 illustrates a sectional view of the diamond device having protruded structures formed after removal of the Si substrate.

FIG. 10-7 illustrates an element which is made by mounting the obtained diamond device on a platinum electrode substrate through a Ti/Au electrode.

EXPLANATION OF SYMBOLS

Figure 1:
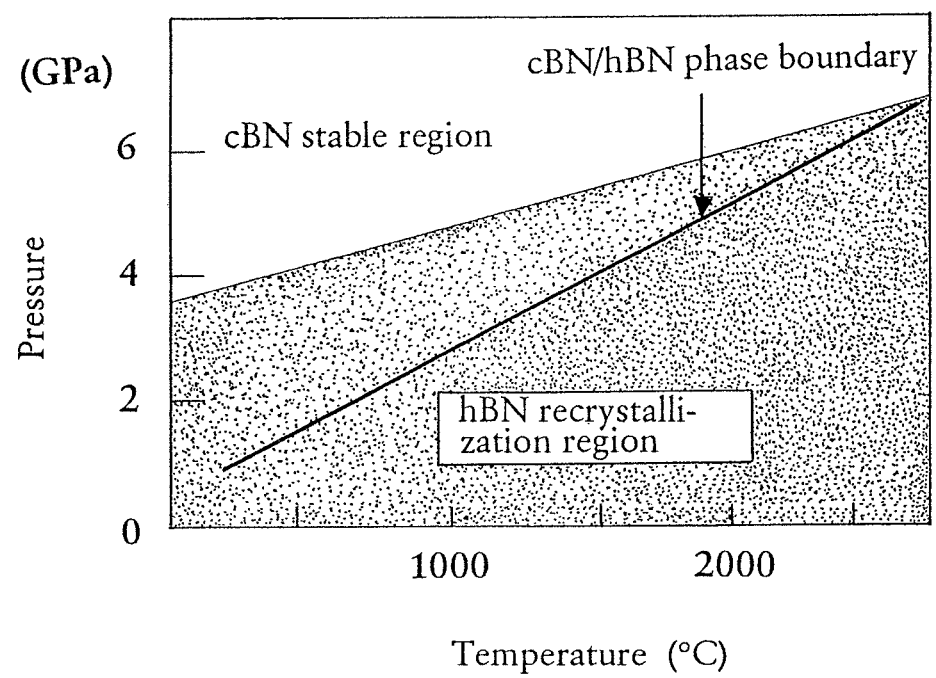
FIG. 1 is a schematic condition diagram showing the region for synthesis of recrystallized hBN.

1: a solid-state laser
2: an electron gun using a $LaB_6$ filament
3: an accelerated electron beam flow
4, 6: electron beam focusing lenses
5: a diaphragm
7: an electron beam objective lens
8: an ellipsoidal mirror
9: a parallel plate of the hexagonal boron nitride crystal
10: ultraviolet laser light
11: a spectrograph
12: a Si substrate
13: a $SiO_2$ layer
14: photoresist patterning
15: $SiO_2$ layer etching
16: etching of Si
17: a diamond layer and pyramid-shaped diamond
18: a Ti/Au electrode
19: a platinum electrode
20: an extraction electrode of Au
21: a glass plate
22: an electron beam
23: far ultraviolet light
24: an anode electrode of Ti/Au
25: a substrate of a hexagonal boron nitride crystal

THE BEST EMBODIMENTS FOR CARRYING OUT THE INVENTION

Hereinafter, the best embodiments for carrying out the present invention are explained in a sequential order from the first group inventions to the third group inventions.

The first group invention of the present invention relates to highly pure hBN single crystals capable of emitting ultraviolet light in far ultraviolet region, synthesis processes thereof, and the light emitting element consisting of said single crystal.

The highly pure hBN single crystal capable of emitting ultraviolet light in the far ultraviolet region is produced by processes to treat the raw material of hBN at high-temperature and under high-pressure in the presence of highly pure solvent of alkali metal or alkaline earth metal boronitride, followed by recrystallization.

By recrystallization, the hBN single crystal free from impurity having high-luminance ultraviolet light emission at the wavelength of 235 nm or shorter, especially at 210 nm to 220 nm, remarkably at 215 nm, can be obtained. The temperature and pressure conditions therefor need high-temperature and high-pressure. As a tentative guidepost, 20,000 atmospheric pressure and 1,500° C. or higher are preferable.

These conditions are the temperature and pressure under which the raw material, boron nitride, is recrystallized into hBN under the coexistence of the solvent. Boronitride of alkali metal or alkaline earth metal used as the solvent must exist stably without oxidization or decomposition during the process. Especially, it is effective to forward the reaction under high-pressure. This suppresses decomposition of the solvent and enables crystal growth for a long time necessary for the synthesis of large and highly pure crystals, and thus is preferable.

However, attention should be paid to the fact that under too high-pressure, the raw material hBN may make phase transition to a high-pressure phase, cBN. That is, in order to obtain intended highly pure hBN single crystals, the temperature and pressure conditions in the region free from cBN single crystal generation are needed. FIG. 1 shows the temperature and pressure conditions to recrystallize hBN. According to this figure, recrystallization of hBN is possible even under the thermodynamically stable conditions of cBN, but transfer to cBN proceeds more easily with the increase in pressure, and so higher reaction temperature, the condition for stable hBN, is necessary in order to forward hBN recrystallization.

That is, as the upper limit pressure for hBN recrystallization, around 6 GPa may be appropriate. Under higher pressure than this, the synthesis conditions must be set at the thermodynamically stable conditions of hBN and the temperature on this occasion is near 3,000° C. This condition is not appropriate for obtaining crystals large enough in size. Therefore, considering the economical efficiency in industrial manufacturing, the upper limit for the synthesis condition of said single crystal may be about 60,000 atmospheric pressure. As for the lower limit, even under 1 atmospheric pressure or lower, synthesis of high-luminance light emitting highly pure hBN crystals through recrystallization may be possible, if decomposition and oxidization of the solvent can be repressed. In the present invention, the high-luminance light emitting highly pure hBN crystals were synthesized in hBN recrystallization region shown by netting in FIG. 1.

On the other hand, boronitride of alkali metal or alkaline earth metal and the like easily react with water and oxygen. hBN recrystallized from the reaction system containing these oxides and the like as impurities was affected by the impurities such as oxygen and the like, and the hBN single crystal capable of showing light emission phenomenon in the short wavelength region at or below 300 nm, could not be obtained. In contrast to this, the present invention can provide highly pure hBN single crystals showing light emission in shorter wavelength region such as at a wavelength of 235 nm or shorter, especially showing high-luminance ultraviolet light emission at a wavelength of 210 nm to 220 nm, remarkably at 215 nm, by using commercially available so-called low pressure phase boron nitride as the raw material and by dissolution thereof into the highly pure solvent followed by recrystallization, which has not been possible to obtain by the conventional techniques or prior arts.

Next, the first group inventions are explained specifically based on examples and figures. However, these examples, etc.

are disclosed for a help of easy understanding of the invention, and the present invention is never limited by these examples and the like.

EXAMPLE 1

Hexagonal boron nitride crystal sintered body (about 0.5 μm grain size) on which deoxidation processing by heat treatment in vacuum at 1,500° C. and in nitrogen gas stream at 2,000° C. had been applied, was loaded into a molybdenum capsule in a high-pressure cell together with a barium boronitride solvent. The preparation of the solvent and loading the sample into the capsule were all performed under dry nitrogen atmosphere. The high-pressure reaction cell was treated at the pressure and temperature conditions of 25,000 atmospheric pressure and 1,700° C. for 20 hours by a belt type high-pressure apparatus. The increasing rate of temperature was around 50° C./min. After cooling with the rate of about 500° C./min, the cell was decompressed and the sample was recovered together with the molybdenum capsule in the high-pressure cell.

The molybdenum capsule was removed by mechanical or chemical treatment (mixed solution of hydrochloric acid and nitric acid), and the sample was recovered. Colorless and transparent hexagonal prism form crystals (around 1 to 3 mm) were obtained, and on the crystals, identification of the phase by optical microscopic observation, SEM observation and X-ray diffraction, and assessment of optical characteristics (transmittance, cathode luminescence) were prosecuted. It was confirmed that the crystal was a single phase of hBN by X-ray diffraction patterns of the crystal grains.

Figure 2:
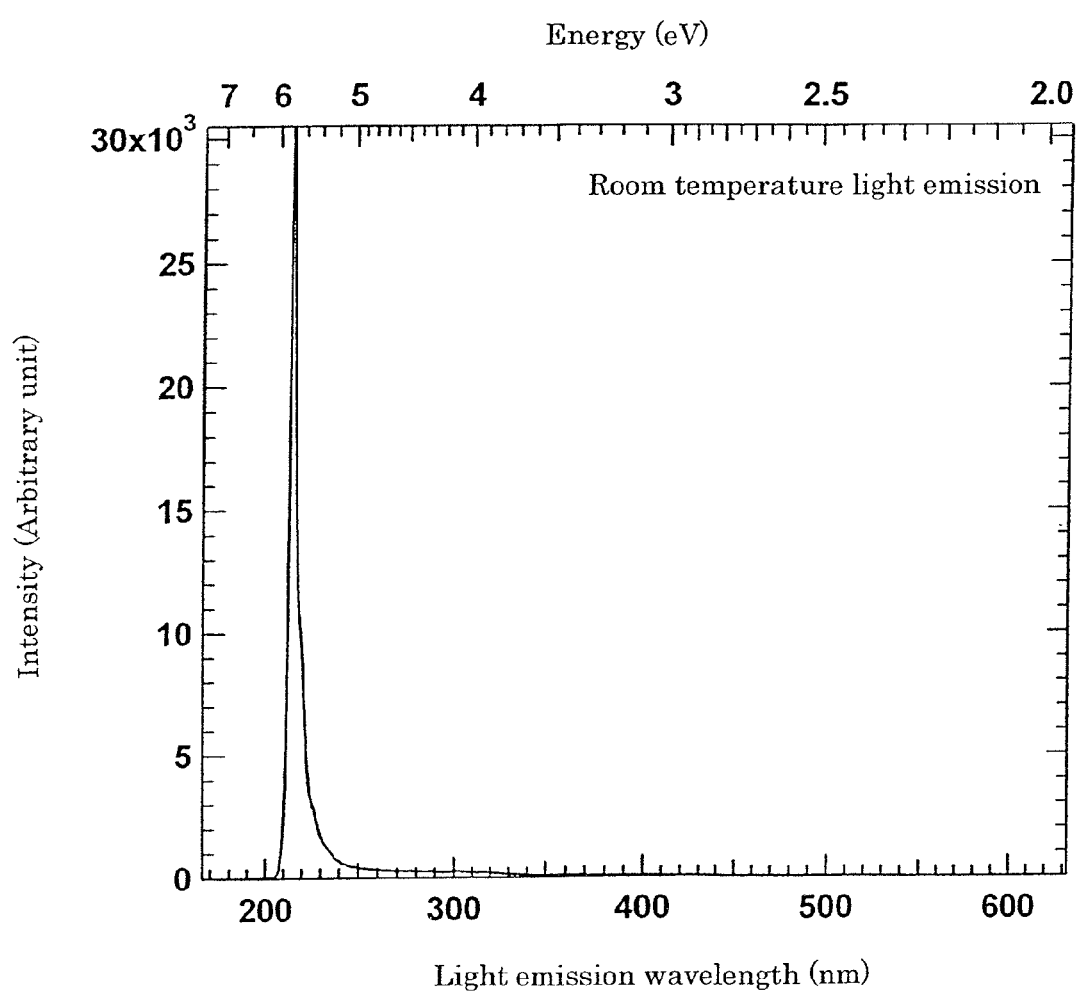
FIG. 2 shows an example of light emission spectra excited by electron beams at room temperature.
Figure 3:
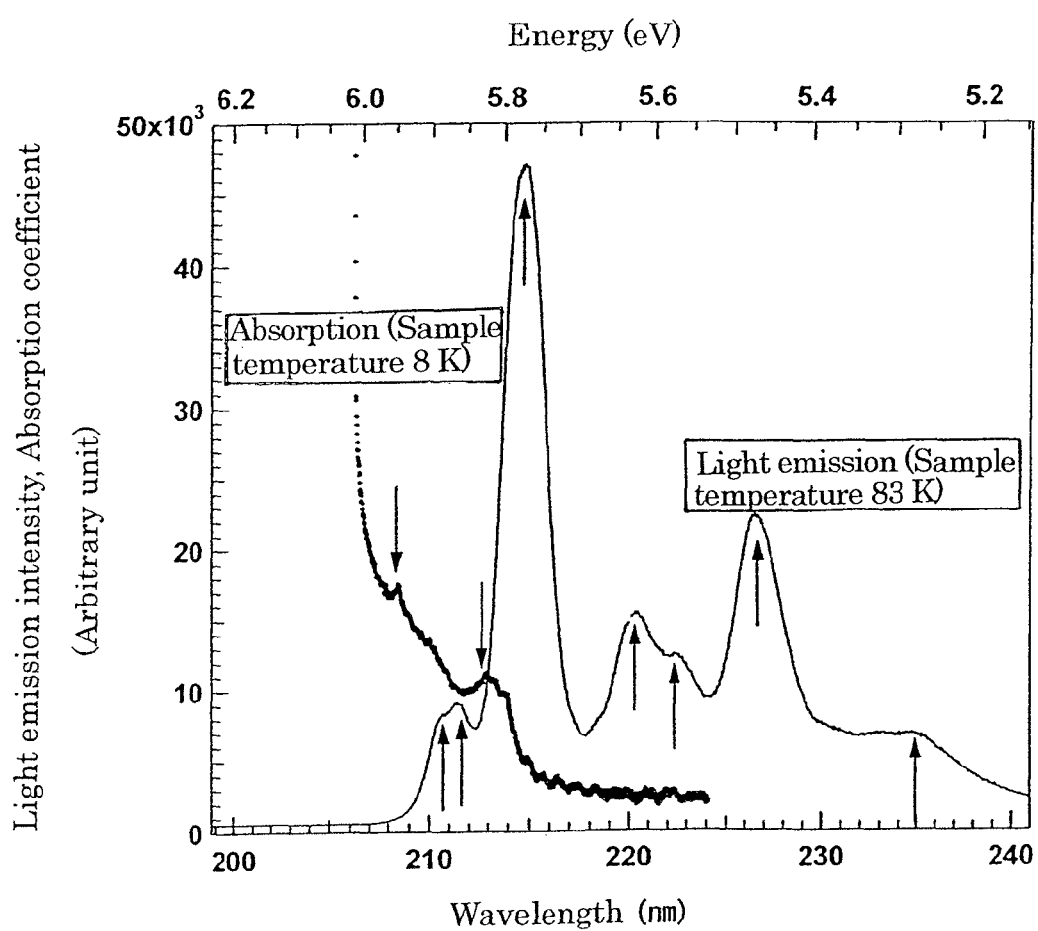
FIG. 3 shows an absorption spectrum and a light emission spectrum excited by the electron beam at low temperature.

By the cathode luminescence observation, single-peaked high-luminance ultraviolet light emission was observed near a wavelength of 215 nm at room temperature as shown in FIG. 2, and, an ultraviolet light emission bands (as shown by up arrows ↑ in the figure) were observed at 210 nm to 235 nm at the temperature of 83 K, as shown in FIG. 3.

In a light absorption observation, high transmittance was shown at a wavelength of 2,500 nm to near 200 nm, and light absorption structures (as shown by down arrows ↓ in the figure) were observed at the wavelengths of 208 nm and 213 nm at the temperature 8 K as shown in FIG. 3.

EXAMPLE 2

A hexagonal boron nitride crystal sintered body (about 0.5 μm grain size), on which deoxidation processing had been applied by heat treatments in vacua at 1,500° C. and in nitrogen gas stream at 2,000° C., was loaded into the molybdenum capsule together with the solvent of mixed barium boronitride and lithium boronitride 1:1 by weight ratio. High-pressure treatment was applied in the same manner as in Example 1 and the sample was recovered.

The recovered sample had a same morphology as in Example 1, and ascertained to be hBN crystal. By cathode luminescence measurement, a broad light emission was observed near 300 nm, together with a high-luminance light emission at a wavelength of 215 nm.

EXAMPLE 3

A hexagonal boron nitride crystal sintered body (about 0.5 μm grain size) on which deoxidation processing by heat treatment in vacuum at 1,500° C. and in nitrogen gas stream at 2,000° C. had been applied, was loaded into a molybdenum capsule together with the solvent of mixed barium boronitride and lithium boronitride 1:1 by weight ratio. The preparation of this solvent and loading of the sample into capsule were all performed under dry nitrogen atmosphere. The molybdenum reaction cell was processed in nitrogen gas stream at the pressure and temperature conditions of 1 atmospheric pressure and 1,500° C. for two hours. The rate of temperature increase was about 10° C./min. The molybdenum capsule was recovered after cooling with the rate of about 20° C./min.

Then, the molybdenum capsule was removed by mechanical or chemical treatment (mixed solution of hydrochloric acid and nitric acid), and the sample inside was recovered. The solvent portion partly showed an aspect of decomposition, but in part, recrystallization was seen at the interface with the hBN raw material. Solvent component was removed by acid treatment. After washing, on the obtained hBN crystal, identification of the phase by optical microscopic observation, SEM observation and X-ray diffraction was prosecuted, and assessment thereof through the optical characteristics tests (transmittance, cathode luminescence) was done.

As a result, a broad light emission near 300 nm was observed by cathode luminescence measurements together with a high-luminance light emission at a wavelength of 215 nm.

In other cases than the above examples 1 to 3, measurements on many samples produced under a little different synthetic conditions made it clear that the maximum luminescence peaks were concentrated in particular at a wavelength of 210 nm to 220 nm, remarkably at 215 nm. Although these maximum luminescence peak widths are narrow, they distribute with a considerable widths. Causes thereof are not altogether clear, but ununiformity of the crystallinity due to defects or minor components such as impurities may concern.

COMPARATIVE EXAMPLE 1

Deoxidation processing by thermal treatment in vacuum at 1,500° C. and in nitrogen gas stream at 2,000° C. had been applied to the commercially available hBN sintered body and hBN powder, and then light emitting behaviors thereof were measured by the cathode luminescence. As a result, no single-peaked strong light emission near 215 nm was observed.

COMPARATIVE EXAMPLE 2

In the case that the solvent used in the processes described in Example 1 contained oxygen impurities due to oxidation in part, recrystallized hBN single crystals could be synthesized by re-using this solvent in hBN synthesis experiments, mixing the raw material with the solvent and treating them with high-temperature and high-pressure. However, by the cathode luminescence measurement, a broad and strong light emission was observed near a wavelength of 300 nm, rather than 215 nm. It is considered that by the effects of impurities such as oxygen, the high-luminance short-wavelength light emission characteristics were inhibited.

The above comparative example 2 instructs that recrystallization using highly pure solvents is important to produce the highly pure hBN single crystals and to make them express good high-luminance light emission characteristics. These examples and comparative examples show that, in the synthetic conditions, atmosphere and high grade purification of the solvents used are important in producing highly pure high-luminance light emitting hBN single crystals in the present invention.

Based on the above findings, using low pressure phase boron nitride as the raw material and highly pure solvents such as barium boronitride, recrystallization of boron nitride was conducted. Then hexagonal boron nitride single crystals showing a behavior of single-peaked high-luminance light emission at a wavelength of 215 nm was obtained.

Next, the second group inventions of the present invention are explained based on examples and figures. However, these specific explanations are disclosed as a help for easy understanding of the invention, and the invention is never limited by these examples. The used materials or numerical conditions such as impurity concentrations or film widths described in the following explanations are some of the examples only, and the invention is never limited by these examples.

EXAMPLE 4

First, both faces of a parallel plate were formed by delamination along the cleavage plane utilizing cleavability of the c plane of the highly pure hexagonal boron nitride crystal obtained in Example 1, and a Fabry-Perot etalon consisting of the parallel plate of several tens of μm in thickness was formed.

Figure 9:
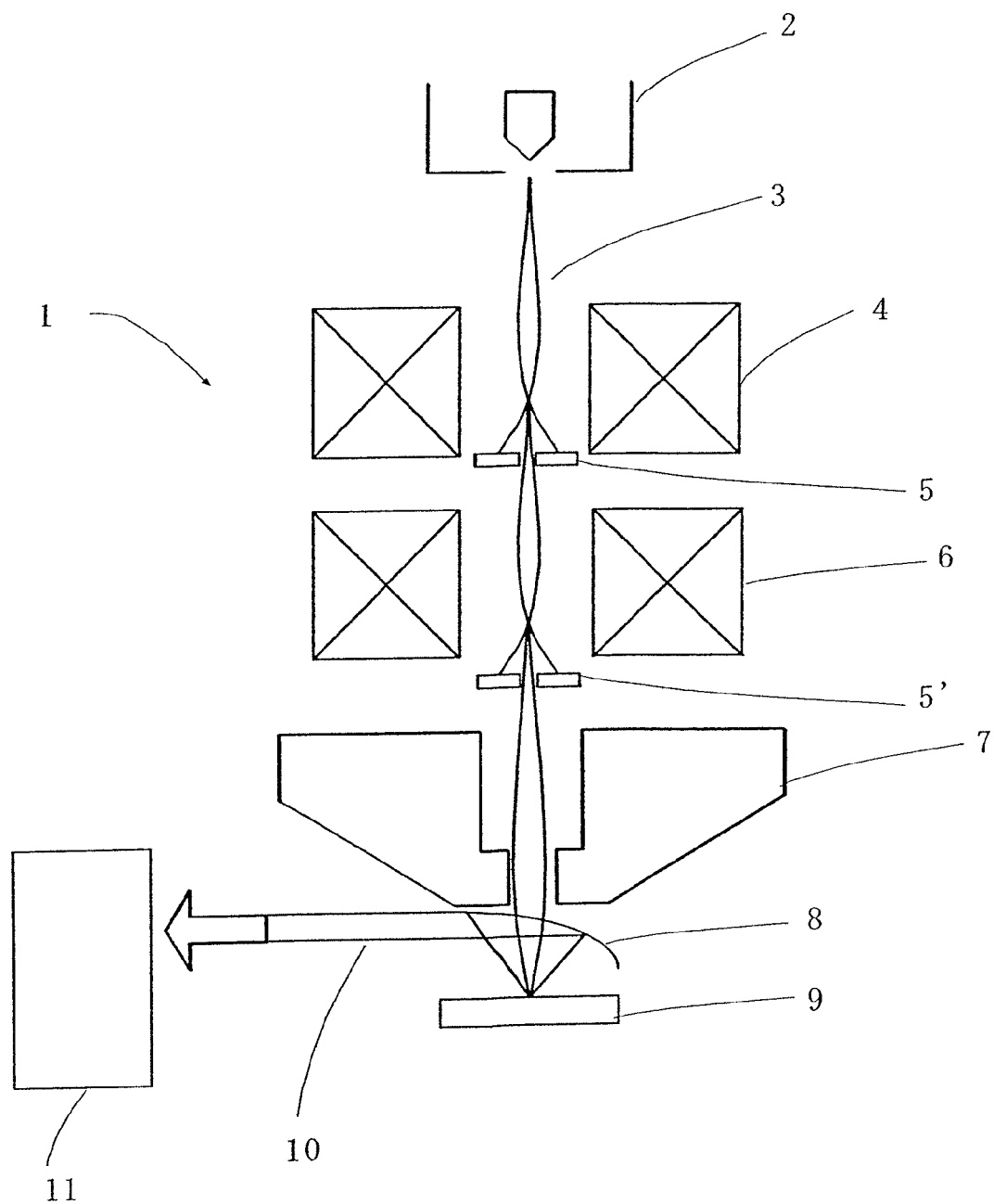
FIG. 9 illustrates a schematic diagram of a solid-state laser wherein the laser light is generated and taken out from a parallel plate sample excited by an electron beam utilizing the accelerated electron beam of an electron microscope.

FIG. 9 shows a far ultraviolet solid-state laser element constructed using this parallel plate and an accelerated electron beam of an electron microscope. In the figure, the element utilizes an electron microscope constructed of machine components: from the electron gun 2 using an $LaB_6$ filament to the electron beam objective lens 7. Electron beam flow 3 emitted from the $LaB_6$ filament of the electron gun was accelerated and incident on the c plane of said parallel plate sample with the energy of 20 KeV and 860 mA/cm$^2$. Emitted light from the sample was then collected by an ellipsoidal mirror 8 to be analyzed by a spectrograph 11.

Figure 4:
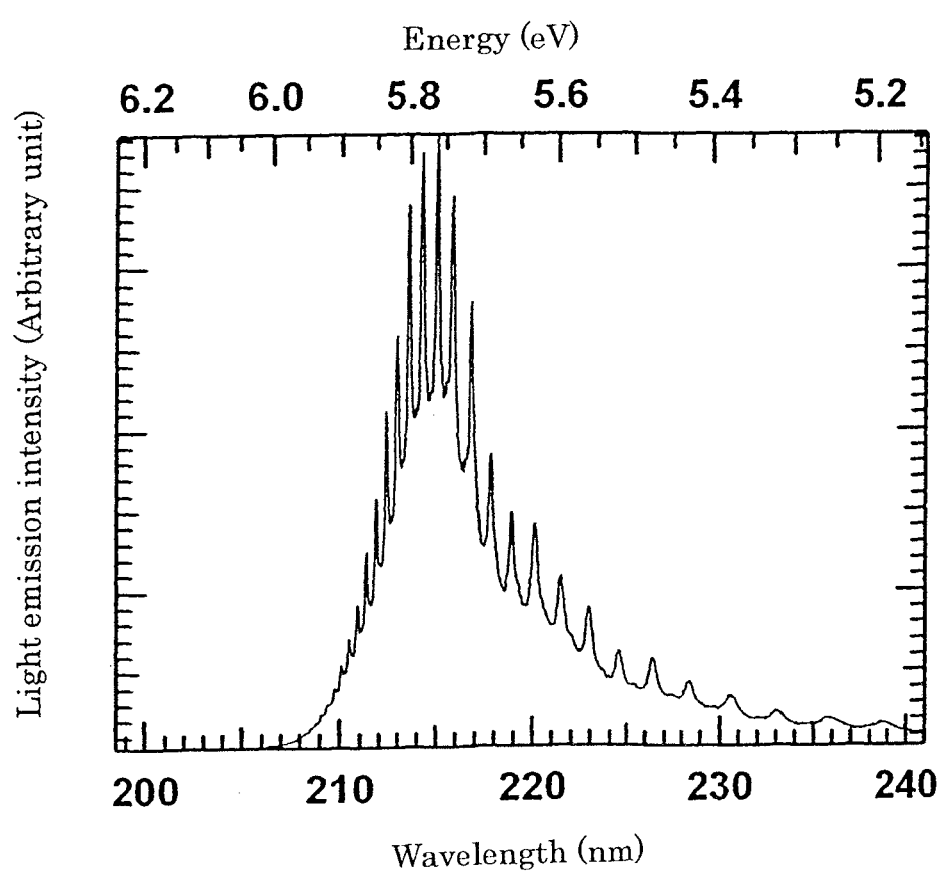
FIG. 4 shows a laser-oscillation spectrum excited by the electron beam.

As a result, it was clarified that far ultraviolet laser light around wavelength region at 215 nm was emitted from the sample excited by the electron beam. FIG. 4 is the laser-oscillation spectrum at that time, from the c plane of the parallel plate sample about 10 μm in thickness. As shown in FIG. 4, there appeared sharp spectrum structures like fine comb-teeth in the light emission centering on near 215 nm. These spectrum structures having shapes of comb-teeth indicate that longitudinal modes of the Fabry-Perot etalon formed by front and back sides of the parallel plate are optically amplified by the induced emission of the hexagonal boron nitride crystal excited by electron beams, and it became clear that laser-oscillation operation took place.

EXAMPLE 5

Figure 5:
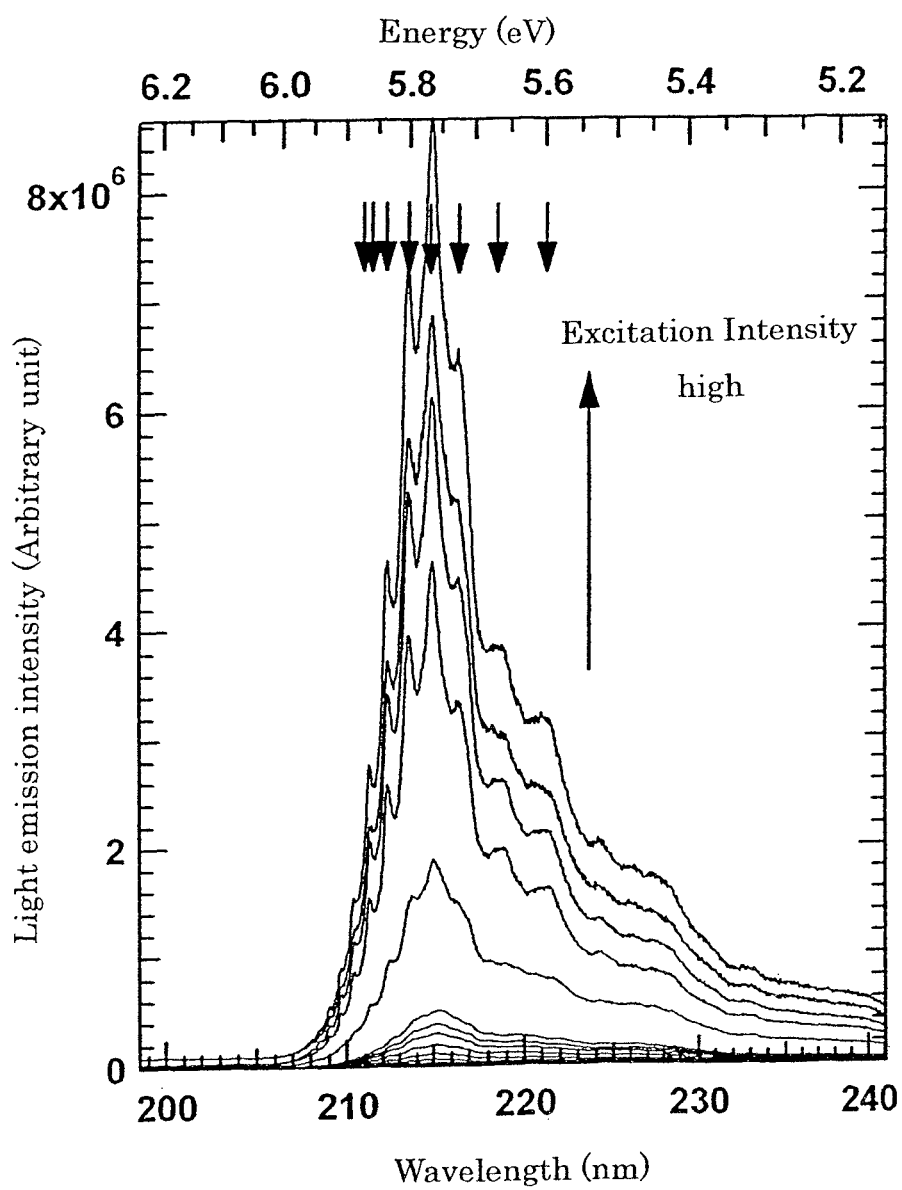
FIG. 5 shows excitation current dependence of the laser-oscillation spectrum excited by the electron beam.
Figure 6:
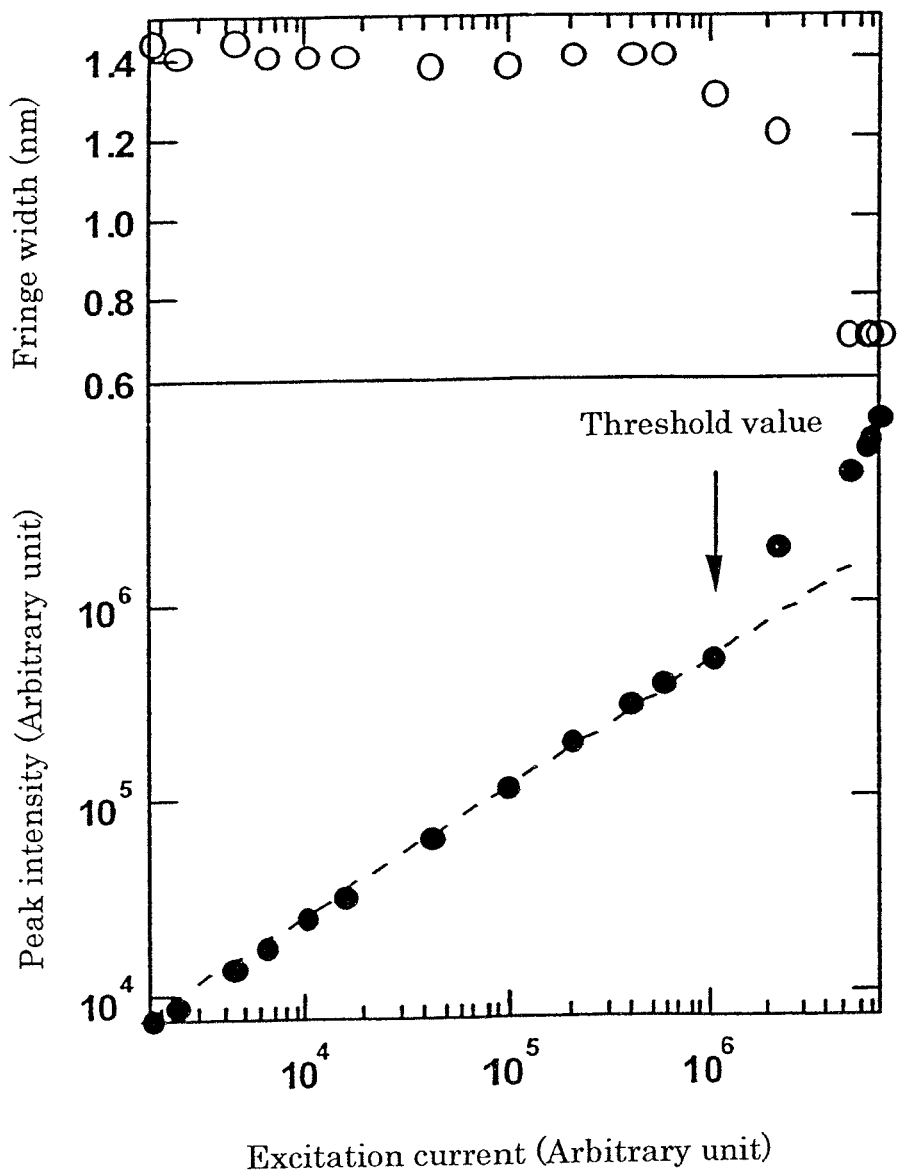
FIG. 6 shows excitation current dependence of both the light emission intensity and the longitudinal mode width (the fringe width) excited by the electron beam.

As in Example 4, making use of cleavability of the boron nitride single crystal obtained in Example 1, a parallel plate sample about 6 μm in thickness was prepared, oscillated and measured in the same way as in Example 4. FIG. 5 and FIG. 6 show results of the measurements. According to these figures, due to the incompleteness of the cleavability, a laser threshold of the electron beam density was elevated and the threshold values of the laser-oscillation operation and light emission operation were observed.

As shown in the lower figure of FIG. 6, when electron beam density (excitation current) is gradually increased, light emission output suddenly starts to increase more rapidly at a certain electron beam density. This electron beam density (excitation current value) can be defined as the threshold value. In FIG. 5, from the spectrum with the largest light emitting intensity to the one with the fifth intensity correspond to the measured points above the threshold at which light emission output suddenly starts to increase rapidly in the lower figure of FIG. 6.

In a resonance mode of Fabry-Perot etalon, that is, a wavelength position of the longitudinal mode shown by ↓ in FIG. 5, these spectra show the width-narrowing of fringe-like spectra in the excitation current value range greater than or equal to the threshold value as is shown in FIG. 6 above, and shows that at each wavelength position of the longitudinal mode the laser-oscillation operates above the threshold value. In this way, with the laser-oscillation threshold value as a borderline, the element is shown to be usable as a laser element at or above the threshold value, and as a solid-state ultraviolet light emitting element other than a laser element below the threshold value.

Laser oscillation operation in the above mentioned example refers to the laser-oscillation operation of the sample, the boron nitride, produced under the specific synthetic condition obtained in Example 1, but this type of laser-oscillation operation is not limited to the one obtained in Example 1. Other than Example 1, similar results were observed on the boron nitride grown under the synthetic conditions of Example 2 or 3.

Figure 7:
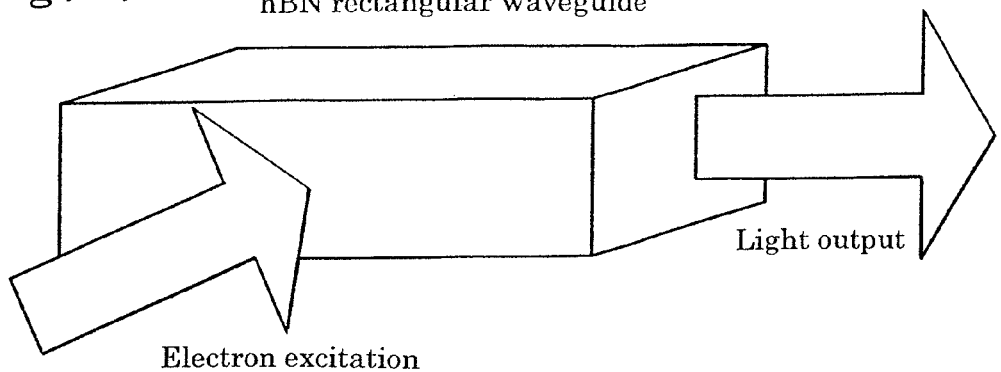
FIG. 7 illustrates an embodiment wherein a plane different from the light emission output plane is excited.

In the above described Examples 4 and 5, the parallel plate Fabry-Perot etalon was used. However, there is a method, wherein, instead of the parallel plate, the hBN crystal is processed into the shape of rectangular waveguide as is shown in FIG. 7. This structure allows light to reflect at both end faces of the waveguide to resonate. The side face, not containing the face to take out the laser light or the emitted light, is excited. Adopting this method, due to the fact that the face excited by electron is different from the faces providing laser resonator mirrors, damages such as pollution and element face brake-down of the laser end face and the excitation end face can be repressed, and also amplification region can be set over the whole waveguide. Also, by optimizing the shape of the light waveguide, single mode oscillations in both transverse mode and longitudinal mode are possible.

Moreover, although a $LaB_6$ filament was used as the source of accelerated electron beam in above described Examples 4 and 5, it is possible to drastically decrease the element size by utilizing, for example, small cathodes such as carbon nanotube emitter or a diamond emitter.

Figure 8:
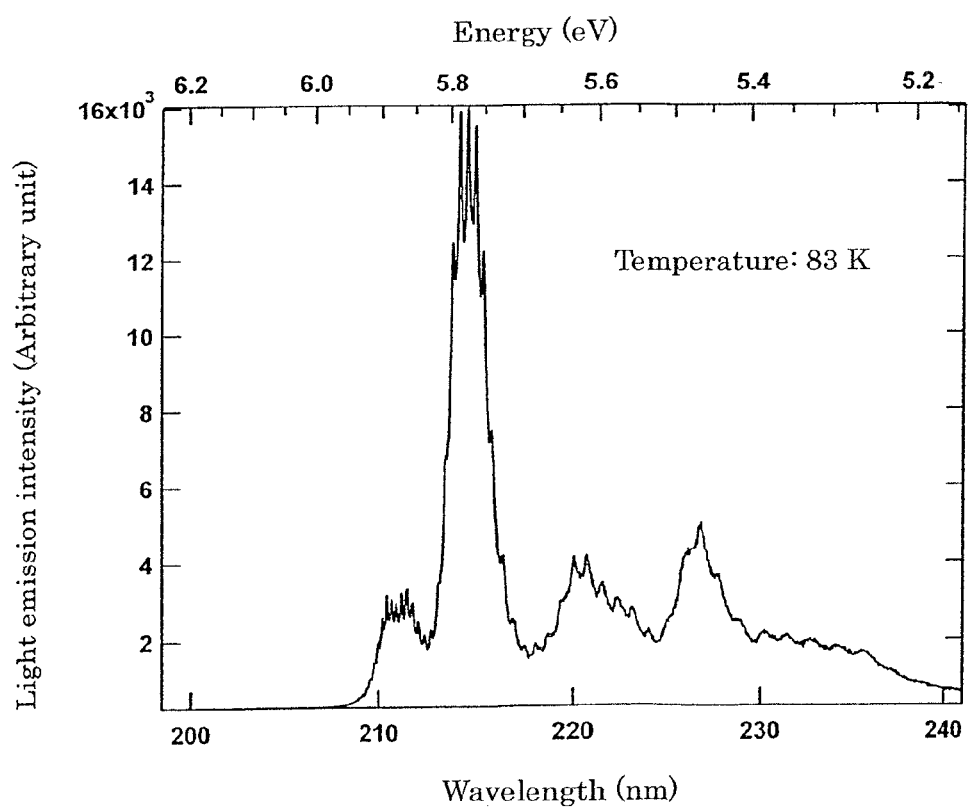
FIG. 8 shows a light emission spectrum excited by the electron beam at low temperature (83 K).

In above mentioned Examples 4 and 5, laser-oscillation and light emission phenomenon of the light emission band with the peak at a wavelength of 215 nm were described. The light emission bands in the wavelength of 210 nm to 235 nm obtained by cooling the above mentioned sample also show laser-oscillation operation, which can be understood by the remarkable increase in light emission intensity at each energy positions of the longitudinal mode as is shown by the spectrum in FIG. 8. Thus, these bands are possible to be utilized as lasers.

In Example 4, as the acceleration energy condition of the electron beam, acceleration voltage of 20 keV and electron density of 860 mA/cm$^2$ were adopted, but the laser-oscillation is not restricted to this condition, but should be determined by the optical loss at both end faces of the laser resonator and the optical loss in the waveguide. With the sample showing the spectrum in FIG. 4, similar oscillation operation is confirmed, for example, at the electron density of 0.2 mA/cm$^2$.

In Examples 4 and 5, the cleavage planes without modification were utilized as reflection planes of the Fabry-Perot etalon. But it is possible to obtain positively a high reflectivity by adopting an embodiment to deposit suitable metals (Al, $MgF_2$) and the like on the cleavage planes to increase the Q value of the resonator and decrease the threshold value. This procedure may be expected as an effective means.

Furthermore, in Examples 4 and 5 described above, an example was disclosed wherein the single crystal obtained in the embodiment of the first group invention was used to design a solid-state laser. This suggests that the boron nitride single crystal itself can be made into a structure appropriate to resonate the light. However, it is evident that the present invention has a function as far ultraviolet generation solid-state light emitting elements, not restricted to the laser element. Therefore, the present invention involves an embodiment as solid-state light emitting elements other than the laser elements. In this case, it is hardly necessary to say that the boron nitride crystal does not need to be constructed into a special structure like the resonator structure of a laser element. The single crystal has only to be cut into a suitable size and shape, whereto an electron beam emitting apparatus is combined, and is used.

Next, the third group inventions of the present invention are explained based on examples and figures. However, also these examples disclosed here are disclosed for a help of easy understanding of the invention, and the invention is never limited by them.

The third embodiments of the present invention provide specific utilization methods for the invention of the highly pure hexagonal boron nitride single crystals with far ultraviolet light emission characteristics obtained in the first embodiments of the present invention, and propose specifically a solid-state light emitting apparatus of electron beam excitation type emitting far ultraviolet light having a single light emission peak at 215 nm.

Figures 1, 10:
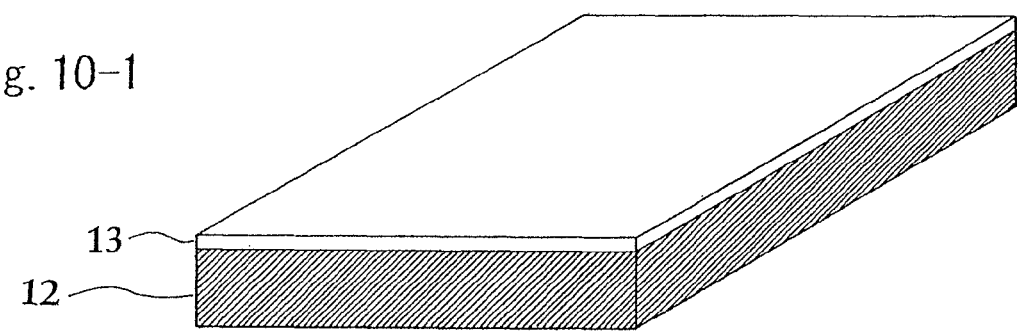
Figures 2, 10:
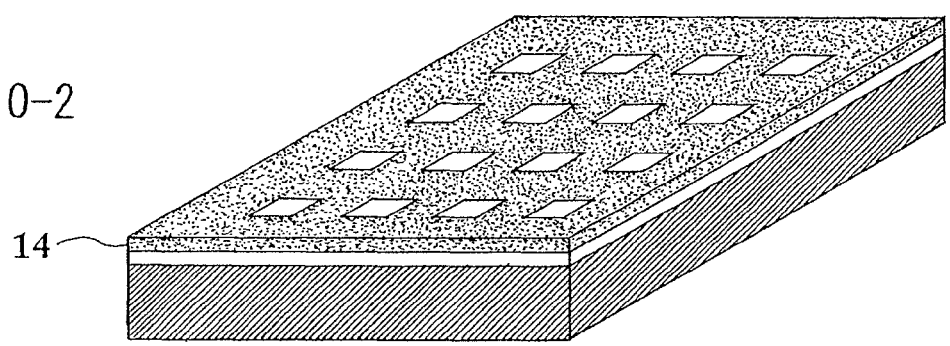
Figures 3, 10:
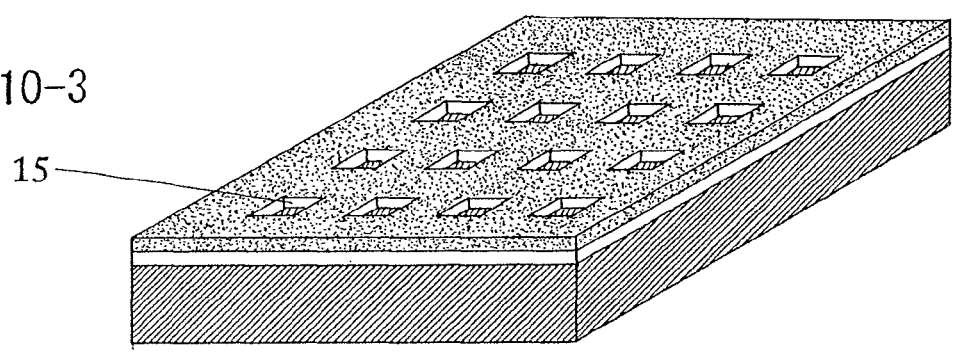
Figures 4, 10:
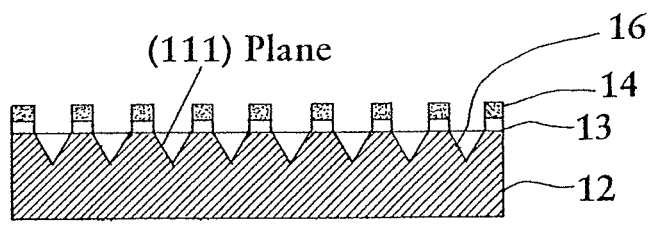
Figures 5, 10:
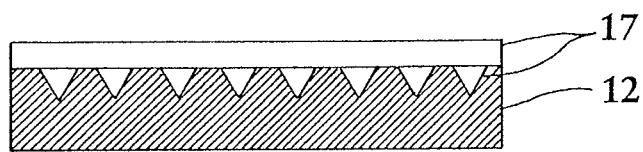
Figures 6, 10:
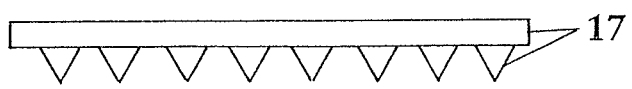
Figures 7, 10:
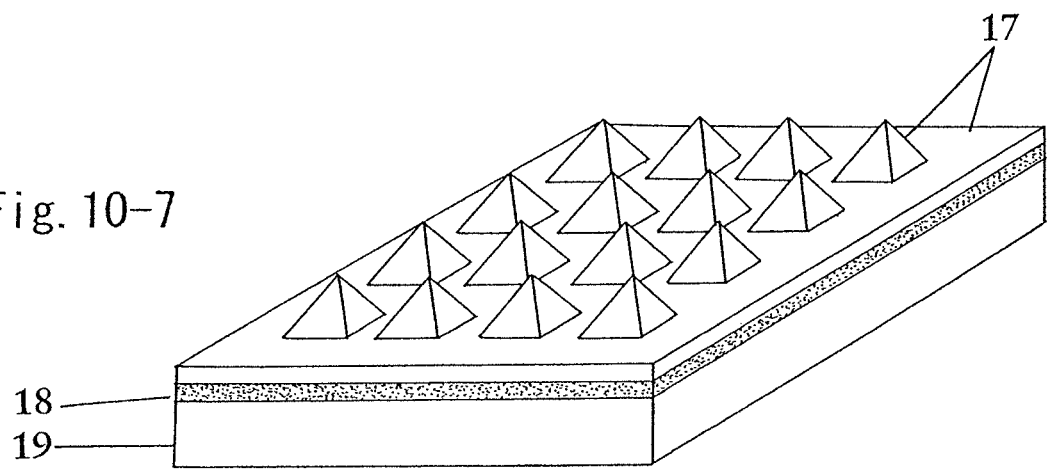
Figure 11:
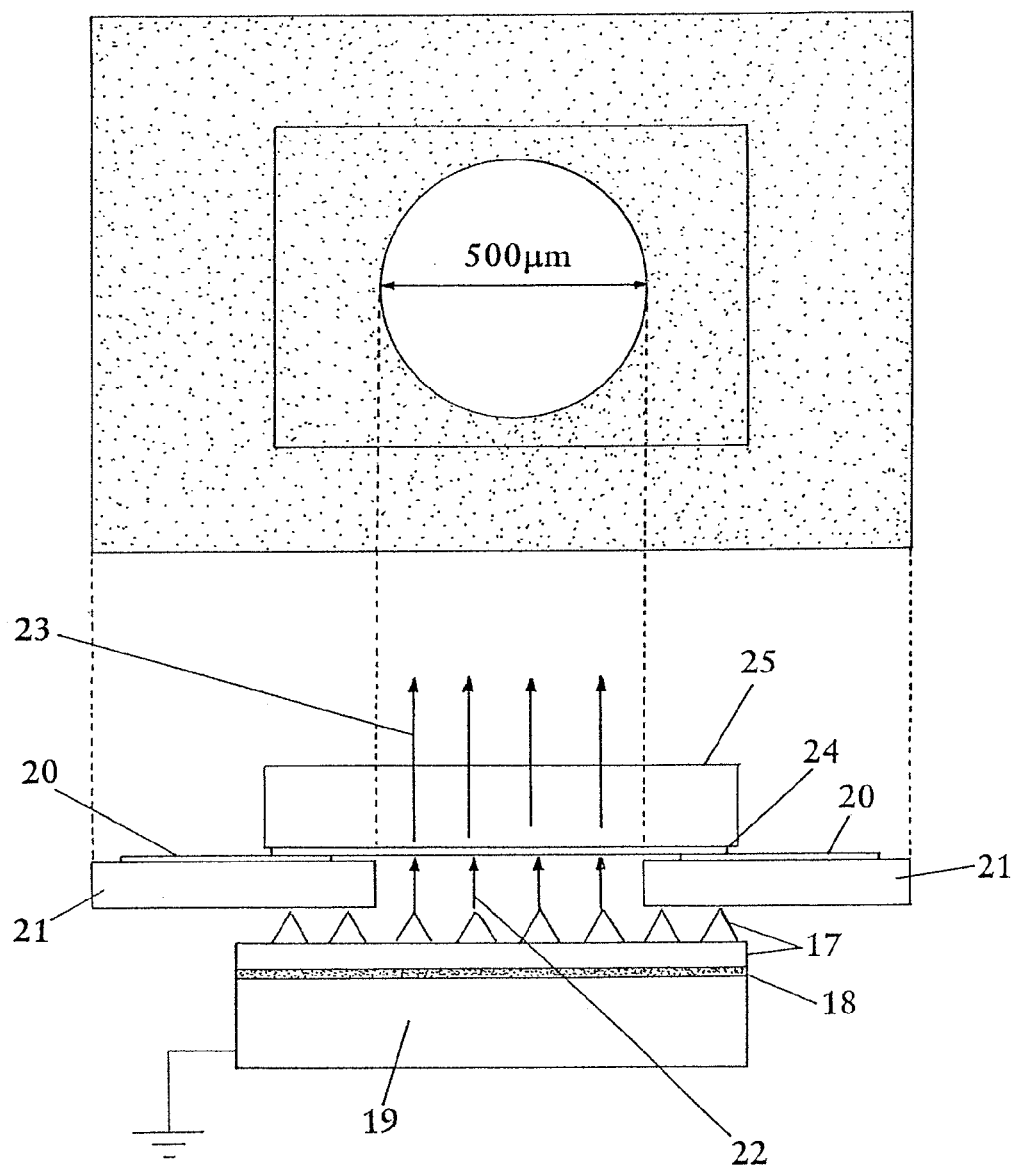
FIG. 11 illustrates the structure of a solid-state far ultraviolet light emitting apparatus of the present invention.
Figure 12:
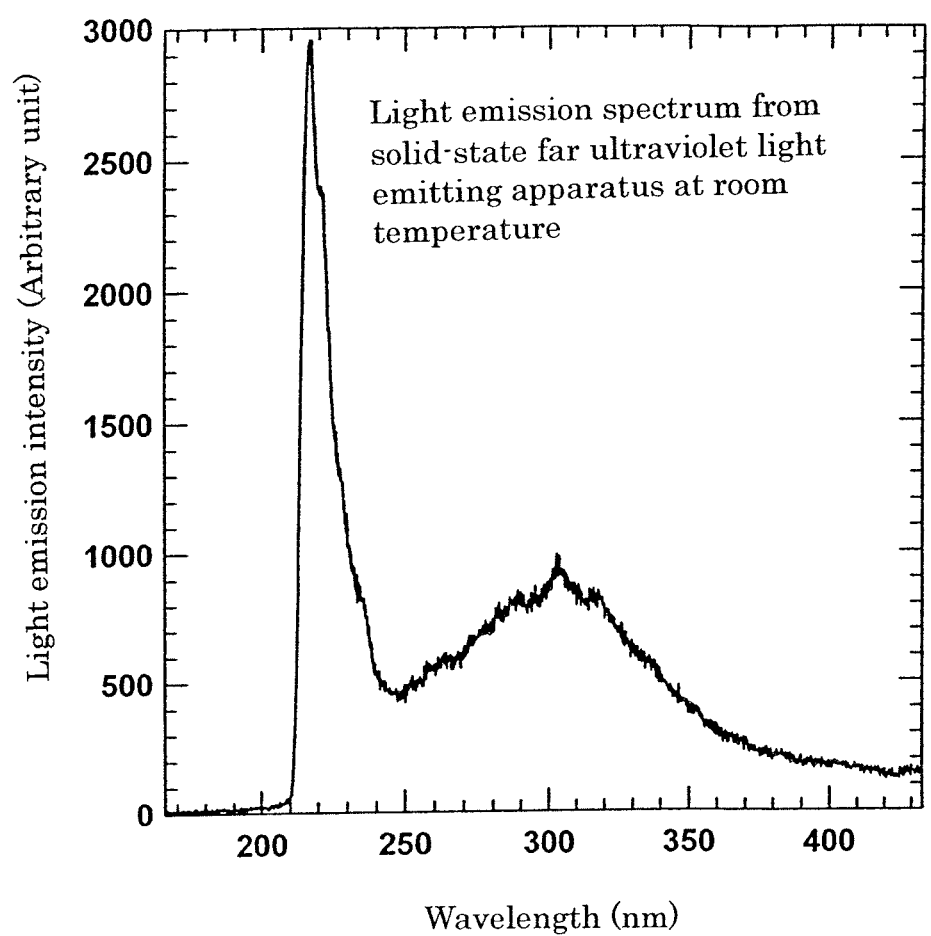
FIG. 12 shows light emission characteristics of the ultraviolet light emitting element.

FIGS. 10-1 to 10-7 are process drawings illustrating each of producing steps of the electron emitting device based on a diamond substrate that causes the light emitting element or the light emitting layer consisting of said single crystal of the present invention to emit light. FIG. 11 illustrates structure of a solid-state far ultraviolet light emitting apparatus of the present invention produced by this process and FIG. 12 shows far ultraviolet light emission characteristics of this apparatus.

EXAMPLE 6

Production processes of the light emitting layer consisting of the highly pure hexagonal boron nitride crystal are disclosed here.

The highly pure hexagonal boron nitride single crystals were produced according to the same processes as in Example 1.

The resultant crystals were analyzed and assessed by various analytical means such as identification of the phase with optical microscopic observation, SEM observation and X-ray diffraction, and optical characteristics tests (transmittance, cathode luminescence). As a result, the crystal was ascertained to be of the single hBN phase. By the cathode luminescence observation, single-peaked high-luminance ultraviolet light emission was observed near a wavelength of 215 nm at room temperature as shown in FIG. 2, and, an ultraviolet light emission spectrum (as shown by ↑ in the figure) was observed at 210 nm to 235 nm at the temperature of 83 K, as shown in FIG. 3.

In a light absorption measurement, high transmittance was shown from the wavelength around 2,500 nm to 200 nm, and light absorption structures (shown by ↓ in the figure) were observed at the wavelengths of 208 nm and 213 nm at the temperature 8 K as shown in FIG. 3.

As the obtained single crystal had strong cleavability along the c plane, slice-shaped thin films of about several millimeters square in area were cut out, making use of this cleavability. Thickness from the extent of several tens of μm to several μm may be enough and preferable. Ti/Au (about 15 nm in thickness) was applied on the back face thereof to form an anode, and was used as the light emitting layer in the solid-state far ultraviolet light emitting apparatus shown in the next Examples 7 and 8.

EXAMPLE 7

Production processes of an electron emitting device made of diamond for exciting the light emitting layer obtained in Example 6 is disclosed. These processes consist of steps illustrated in from FIG. 10-1 to FIG. 10-7.

As shown in FIG. 10-1, a silicon (100) substrate 12 is provided, and $SiO_2$ layer 13 of about 200 nm in thickness is formed on the substrate. Next, after photoresist was applied uniformly, square pits with one side 70 μm in length were formed at intervals of 7 μm (FIG. 10-2) using a photoresist pattern 14, and then naked $SiO_2$ part was etched 15 by hydrogen fluoride aqueous solution to form a mask pattern on the $SiO_2$ layer 13 (FIG. 10-3). Next, concave pyramid-shaped pits consisting of four (111) planes are formed on the Si (100) substrate 12 by 15% $(CH_3)_4NOH$ solution heated to 90° C. (FIG. 10-4).

After this photoresist and $SiO_2$ on the substrate are removed using hydrogen fluoride aqueous solution or the like, a boron-added diamond plane is formed by using hot filament CVD method or the like and mixing diborane gas $(B_2H_6)$ to make the boron atom/carbon atom concentration ratio of about 100 ppm (FIG. 10-5). Here, as the diamond plane must support itself, a thickness of about tens of μm is needed. Next, the Si substrate 12 forming the mold is dissolved away by a liquid mixture of $HF:HNO_3=1:1$ to form a diamond substrate 17 with pyramid-shaped structures (FIG. 10-6). Designating the face with diamond minute protrusion structures as the front face, a Ti/Au contact 18 for an electrode is formed on the back face, and then the diamond plate is placed on an electrically conductive substrate such as platinum substrate 19 (FIG. 10-7).

EXAMPLE 8

Construction processes of a far ultraviolet light emitting apparatus (FIG. 11).

A glass plate 21 (about 100 μm in thickness) for insulation was provided on the electron emitting element produced by the procedure like in Example 7, a circular hole with a diameter of about 500 μm was formed, and gold (Au) 20 was vapor-deposited on the surface around the hole edge with thickness of about 50 μm as shown in the figure. On this gold-deposited plane 20, the thin film of the hexagonal boron nitride crystal produced in Example 6 was placed so that Ti/Au-deposited face thereof contacts with the gold-deposited plane, and thus an electron emission device having the face 17 with the pyramid-shaped minute diamond protrusions as a cathode and the Ti/Au face on the hexagonal boron nitride film as an anode 24 is formed. In this case, the gold-deposited plane on the glass plate works as an extraction electrode for the anode. The ultraviolet-emission window of this ultraviolet light emitting element is encapsulated in a glass tube having an window of quartz or the like, electrodes are pulled out, and the glass tube is made to be vacuum (for example, high vacuum at $1 \times 10^{-5}$ Torr or lower).

EXAMPLE 9

Operation procedure of the far ultraviolet light emitting apparatus constructed as described above is shown.

By grounding the electrode on the platinum substrate of the far ultraviolet light emitting apparatus and applying a voltage of about 1 kV or higher on the anode extraction electrode 24, electrons are emitted from the emitting source of the diamond pyramid-shaped minute protrusions 17 and excite the hexagonal boron nitride crystal 25. The excited hexagonal boron nitride crystal 25 exhibited light emission with the peak at 215 nm at room temperature. The emitted ultraviolet light is taken out from the back surface of the hexagonal boron nitride crystal, and is obtained through the ultraviolet-emission window. FIG. 12 shows a light-emission spectrum (with a peak at about 215 nm and also light-emission bands at 300 nm) of this light emitting apparatus.

EXAMPLE 10

Procedures of laser-oscillation operation of the far ultraviolet light emitting apparatus are shown.

Experimental data already known in the art (non patent literature 3) have shown that the hexagonal boron nitride crystal plate can perform laser-oscillation by an acceleration voltage of about 20 kV when the excitation current density is set to about 0.2 mA/cm$^2$. At the acceleration voltage of 1 kV in this case, number of pairs of an electron and a positive hole equivalent to the above condition can be achieved at about 4 mA/cm$^2$. With the current of about 10 μA, the far ultraviolet light emitting apparatus is considered to perform laser operation.

Also, by depositing an appropriate metal (Al, MgF$_2$) or the like on the upper face of the cleavage plane, effects to obtain high reflectivity to increase the Q-value of the resonator, and to decrease the threshold value, are expected. Further, by using a uniform Al film instead of the Ti/Au film on the lower surface of the hexagonal boron nitride crystal, similar increase in the Q-value and decrease in the threshold value are expected.

As shown in the above examples, the present invention has succeeded in obtaining a compact and highly efficient ultraviolet light emitting element or an apparatus completely different from conventional far ultraviolet light emitting apparatuses. These examples show just only some embodiments thereof, and the present invention is not limited to the above examples. For example, the far ultraviolet light emitting apparatus in the above described examples uses the boron nitride produced under the specific synthetic condition obtained in Example 1, and the far ultraviolet light-emission by electron beam excitation of this boron nitride is referred to here. However, the light emission like this is not limited to the one obtained in Example 1. Besides Example 1, similar results were observed on the boron nitride grown under the synthetic conditions of Example 2 and 3.

In the above examples, the diamond emitter is used as an electron beam source, but, for example, a carbon nano-tube emitter or the like may also be utilized.

Moreover, as for the pyramid-shaped minute protrusions, by further increasing in number, arranging in a lattice-like manner, and controlling individual protrusion independently, a patterned electron beam emission and far ultraviolet light emission can be obtained and utilized for display apparatus and the like, for example.

Non-patent literature 3: Nature Materials, vol. 3, 404-409 (2004)

INDUSTRIAL APPLICABILITY

The present invention provides a hexagonal boron nitride single crystal showing a strong high-luminance light emitting behavior at the wavelength of 235 nm or shorter, especially at 210 to 215 nm, having been never obtained by the prior arts. Due to this, a solid-state high-luminance ultraviolet light emitting element has become possible to be easily designed. In addition, it is of great significance that the invention has provided a basic material capable of responding to recent increasing needs for developing higher density recording media, and the present invention is expected to contribute largely to the development of industry. Also, needs for sterilization treatment by ultraviolet light have recently been taken up seriously as one of the important environmental measures. The present invention provides effective materials therefor, and is expected to contribute to the industrial developments in this aspect and to serve greatly for the improvements of the sliving environment in the future.

What is claimed is:

1. A method for producing hexagonal boron nitride single crystals, comprising:
   mixing boron nitride crystals with a solvent thereby obtaining a mixture;
   heating and melting the mixture under at least 1,500° C. and 20,000-60,000 atmospheric pressure thereby obtaining a melted mixture; and
   recrystallizing the melted mixture thereby producing hexagonal boron nitride single crystals,
   wherein the solvent is
      barium boronitride, or boronitride of alkali metal and the barium boronitride.

2. The method according to claim 1, wherein the boronitride of alkali metal is lithium boronitride.

3. The method according to claim 1, wherein the solvent is substantially free from impurities containing oxygen.

4. The method according to claim 1, wherein the hexagonal boron nitride single crystals have a maximum light emission peak in a far ultraviolet region at a wavelength of 235 nm or shorter.

5. The method according to claim 4, wherein the hexagonal boron nitride single crystals have the maximum light emission peak in the far ultraviolet region at the wavelength of 210-220 nm.

6. The method according to claim 5, wherein the hexagonal boron nitride single crystals have the maximum light emission peak in the far ultraviolet region at the wavelength of 215 nm.

* * * * *